United States Patent
Zhou

(10) Patent No.: US 11,520,180 B2
(45) Date of Patent: Dec. 6, 2022

(54) QUANTUM DOT MATERIAL STRUCTURE, LIQUID CRYSTAL DISPLAY DEVICE, AND ELECTRONIC DEVICE

(71) Applicant: TCL CHINA STAR OPTOELECTRONICS TECHNOLOGY CO., LTD., Guangdong (CN)

(72) Inventor: Miao Zhou, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 220 days.

(21) Appl. No.: 16/765,434

(22) PCT Filed: Apr. 24, 2020

(86) PCT No.: PCT/CN2020/086697
§ 371 (c)(1),
(2) Date: May 19, 2020

(87) PCT Pub. No.: WO2021/189590
PCT Pub. Date: Sep. 30, 2021

(65) Prior Publication Data
US 2022/0113585 A1    Apr. 14, 2022

(30) Foreign Application Priority Data
Mar. 27, 2020   (CN) .......................... 202010230323.5

(51) Int. Cl.
*G02F 1/1335* (2006.01)
*C01G 9/08* (2006.01)
(Continued)

(52) U.S. Cl.
CPC ......... *G02F 1/133514* (2013.01); *C01G 9/08* (2013.01); *C01G 28/00* (2013.01);
(Continued)

(58) Field of Classification Search
CPC . G02F 2/02; G02F 2001/01791; H01L 33/50; H01L 33/507; H05B 33/145; B82Y 30/00; C01P 2004/64
See application file for complete search history.

(56) References Cited

U.S. PATENT DOCUMENTS

2007/0104865 A1   5/2007 Pickett
2013/0083509 A1*  4/2013 Ko ..................... G02B 27/1053
                                                          362/84
(Continued)

FOREIGN PATENT DOCUMENTS

CN    101346306 A    1/2009
CN    103936068 A    7/2014
(Continued)

*Primary Examiner* — Michael H Caley
*Assistant Examiner* — Jonathan Y Jung
(74) *Attorney, Agent, or Firm* — PV IP PC; Wei Te Chung; Ude Lu

(57) ABSTRACT

The present invention provides a quantum dot material structure, a liquid crystal display device, and an electronic device. The quantum dot material structure is applied in the liquid crystal display device. The quantum dot material structure includes a quantum dot core, a quantum dot shell, and a quantum dot ligand layer in order from an inside to an outside. The quantum dot core comprises a cadmium arsenide magic-size, and the quantum dot core is used to absorb green light of a predetermined wavelength. The quantum dot shell is used to protect the quantum dot core. The quantum dot ligand layer is used to promote a structural dispersion of the quantum dot material.

15 Claims, 2 Drawing Sheets

(51) Int. Cl.
*C01G 28/00* (2006.01)
*C09K 11/56* (2006.01)
*C09K 11/74* (2006.01)
*G02F 1/13357* (2006.01)
*G02F 2/02* (2006.01)
*B82Y 20/00* (2011.01)
*B82Y 30/00* (2011.01)
*B82Y 40/00* (2011.01)
*H01L 33/50* (2010.01)

(52) U.S. Cl.
CPC ........ *C09K 11/565* (2013.01); *C09K 11/7492* (2013.01); *G02F 1/133528* (2013.01); *G02F 1/133603* (2013.01); *G02F 2/02* (2013.01); *B82Y 20/00* (2013.01); *B82Y 30/00* (2013.01); *B82Y 40/00* (2013.01); *C01P 2004/32* (2013.01); *C01P 2004/64* (2013.01); *C01P 2004/80* (2013.01); *C01P 2006/60* (2013.01); *H01L 33/50* (2013.01); *H01L 33/507* (2013.01)

(56) References Cited

U.S. PATENT DOCUMENTS

| | | | |
|---|---|---|---|
| 2017/0029697 A1* | 2/2017 | Ghosh | C09K 11/881 |
| 2017/0186819 A1* | 6/2017 | Yun | H01L 51/5253 |
| 2017/0256591 A1 | 9/2017 | Li | |
| 2018/0059485 A1* | 3/2018 | Nam | H01L 27/322 |
| 2018/0088262 A1 | 3/2018 | Lee | |
| 2019/0033659 A1* | 1/2019 | Lin | G02F 1/133514 |
| 2019/0330525 A1 | 10/2019 | Hens et al. | |
| 2019/0369438 A1 | 12/2019 | Huang et al. | |
| 2020/0264461 A1* | 8/2020 | Kuwana | C09K 19/601 |
| 2021/0151637 A1* | 5/2021 | Martin | H01L 33/502 |

FOREIGN PATENT DOCUMENTS

| | | |
|---|---|---|
| CN | 105278153 A | 1/2016 |
| CN | 105514295 A | 4/2016 |
| CN | 107884860 A | 4/2018 |
| CN | 108776362 A | 11/2018 |
| CN | 108828832 A | 11/2018 |
| CN | 110088227 A | 8/2019 |
| WO | 2019081401 A1 | 5/2019 |

* cited by examiner

QUANTUM DOT MATERIAL STRUCTURE, LIQUID CRYSTAL DISPLAY DEVICE, AND ELECTRONIC DEVICE

FIELD OF INVENTION

The present disclosure relates to the field of quantum dot technology, and more particularly, to a quantum dot material structure, a liquid crystal display device, and an electronic device.

BACKGROUND OF INVENTION

Liquid crystal display (LCD) devices have outstanding characteristics such as low voltage, micro power consumption, long lifetime, no radiation, and thinness, and stand out among many flat display devices to become a type of display devices which has seen the most mature development, been the most widely used, been industrialized, and is still rapidly developing. However, LCDs cannot achieve self-illumination, and beautiful images we can see are results of their modulation of light. Therefore, a backlight module that provides a backlight for LCDs is one of the most important parts, and lighting effect of the backlight module will directly affect visual effect of display modules. Light source of white light emitting diodes (LEDs) comes from rare earth phosphors excited by blue light LED chip. The white light LEDs converted by these traditional phosphors have a low color rendering index (usually below 80) and a high color temperature (usually above 5000 K) due to lack of red-light spectrum, making their application limited. Therefore, new fluorescent materials with low cost, high efficiency, and high color rendering index have attracted more and more attention. Quantum dots (QDs) are a new type of semiconductor fluorescent material. The material is a nanomaterial with a zero-dimensional structure, and this nanoscale structure has quantum size effects. As particle size of the quantum dots decreases, emission color of the quantum dots moves from red to blue. Since emission band of quantum dot material in visible light emission spectrum is adjustable, people can prepare corresponding quantum dot materials according to needs of light sources, which is unmatched by other luminescent materials. Because spectrum of the quantum dots is adjustable, a high color gamut backlight system can be realized. Moreover, quantum dots have a narrower width at half height (less than 30 nm), which enables purer monochromatic light, thereby making display images more vivid and brighter. Compared with traditional phosphors, under same light intensity, quantum dots require fewer light sources, and automatically use less electricity in a conversion process, so they have an advantage in saving energy.

Eyes are the most important sensory organs for humans to perceive outside world. Through vision, more than 80% of external information can be obtained. Liquid crystal panels are a direct medium for transmitting information, so an amount of color information that the liquid crystal panels can transmit determines an amount of information people get. Larger color gamut value represents that displayed colors are more plentiful and more colorful, and more information can be perceived by eyes. Current mainstream LCD technology uses red, green, and blue (RGB) color resists to achieve different RGB color displays for white light. At present, most quantum dot backlight modules use a combination of quantum dot films and blue LEDs to improve color gamut of LCDs. However, RGB color resists cannot completely absorb light of other wavelengths, which reduces color purity of pure color images under RGB255 gray scale. Traditional technology improves color gamut by increasing thicknesses of RGB color resists. Increasing thicknesses of RGB color resist s will increase purity of RGB color and reduce brightness value, which, when reflected to spectrum, means a reduction of full width at half maximum (FWHM) and peaks. As film thickness increases, color gamut value gradually increases, but an amount of increase in color gamut value is less than an amount of decrease in efficiency. Therefore, if thicknesses of RGB color resistance films are increased to improve color gamut, other methods are needed to optimize transmittance. The current technology also comprises adding other absorbing materials to RGB color resists to improve color gamut. Due to wide absorption spectrum of materials thereof, LCD transmission is significantly reduced, and energy efficiency is increased. In addition, the above solutions will significantly increase cost of RGB color resists.

Thus, under premise of ensuring higher LCD transmission, how to improve RGB color purity, reduce light leakage, and increase color gamut to display bright images and pursue more realistic image quality have become technical problems that urgently need to be solved by those skilled in the art, as well as a constant focus of research.

SUMMARY OF INVENTION

An embodiment of the present disclosure provides a quantum dot material structure which applied in liquid crystal display devices and absorb green light of a predetermined wavelength. The quantum dot material structure can solve problems in the prior art that red, green, and blue (RGB) color resists cannot completely absorb light of other wavelengths, which causes color purity of the liquid crystal display devices to decrease, and color gamut to affect visual effect. Compared with traditional scheme of using a thicker RGB color resists film to improve color gamut, the embodiment of the present disclosure can prevent influence on brightness. Compared with the current method of adding other absorbing materials to the RGB color resistance to improve color gamut, the present disclosure has higher energy efficiency and lower cost.

In summary, an embodiment of the present disclosure provides a quantum dot material structure, a liquid crystal display device, and an electronic device to solve problems in the prior art that red, green, and blue (RGB) color resists cannot completely absorb light of other wavelengths, which causes color purity of the liquid crystal display devices to decrease, and color gamut to affect visual effect.

Therefore, embodiments of the present disclosure provide technical solutions as follows:

A first aspect of the present disclosure provides a quantum dot material structure applied in a liquid crystal display device. The quantum dot material structure comprises a quantum dot core, a quantum dot shell, and a quantum dot ligand layer in order from an inside to an outside. The quantum dot core comprises a cadmium arsenide magic-size, and the quantum dot core is used to absorb green light of a predetermined wavelength. The quantum dot shell is used to protect the quantum dot core. The quantum dot ligand layer is used to promote a structural dispersion of the quantum dot material.

Furthermore, the quantum dot shell comprises one or more of following materials: ZnSe, ZnS, ZnO, $SiO_2$, and a quantum dot hydrogel.

Furthermore, the quantum dot ligand layer comprises one or more of following materials: pyridine, organic acid, alkyl mercaptan, mercapto acid, mercaptoamine, organic amine, and organic phosphorus.

Furthermore, the predetermined wavelength is 535 nm.

A second aspect of the present disclosure provide a liquid crystal display device comprising the quantum dot material structure and the color resistance layer according to the first aspect, wherein the color resistance layer comprises a red color resist, a blue color resist, and a green color resist, and the quantum dot material structure is distributed in the red color resist and the blue color resist.

Furthermore, the liquid crystal display device further comprises a blue diode light source.

A third aspect of the present disclosure provides a liquid crystal display device comprising a color resistance layer and a polarizing layer. The color resistance layer comprises a red color resist, a blue color resist, and a green color resist. A quantum dot material structure is coated on the polarizing layer corresponding to projection positions of the red color resist and the blue color resist.

Furthermore, the polarizing layer comprises an upper polarizing layer and a lower polarizing layer, and the quantum dot material structure is coated on the lower polarizing layer.

Furthermore, the quantum dot material structure is coated on an outside of the lower polarizing layer.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

DETAILED DESCRIPTION OF PREFERRED EMBODIMENTS

Figure 1:
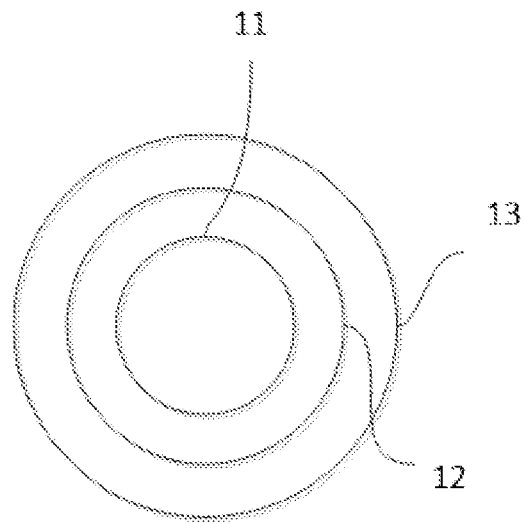
FIG. 1 is a schematic structural diagram of a quantum dot material structure of an embodiment of the present disclosure.

The technical solutions of a quantum dot material structure, a liquid crystal display device, and an electronic device in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

In descriptions of the present disclosure, it should be noted that, orientations or position relationships indicated by the terms, such as "center", "longitudinal", "transverse", "length", "width", "thickness", "upper", "lower", "front", "back", "left", "right", "vertical", "horizontal", "top", "bottom", "inside", "outside", etc. are based on the orientations or position relationships shown in the drawings. These are only convenience for describing the present disclosure and simplifying the descriptions, and does not indicate or imply that the device or element must have a specific orientation, a structure and an operation in the specific orientation, so it cannot be understood as a limitation on the present disclosure. In addition, the terms "first" and "second" are used for describing purposes only, and cannot be understood as indicating or implying relative importance or implicitly indicating the number of technical features indicated. Thus, the features defined as "first" and "second" may explicitly or implicitly include one or more of the features. In the descriptions of the present disclosure, the meaning of "plurality" is two or more, unless it is specifically defined otherwise.

In the present disclosure, the term "embodiment" is used to mean "an example, an illustration, or a specification." Any embodiment described as "exemplary" in the present disclosure is not necessarily to be construed as preferred or advantageous over other embodiments. In order to enable anyone skilled in the art to implement and use the present disclosure, and descriptions are as follows. In the following description, details are listed for explanatory purposes. It should be understood by those of ordinary skill in the art that the present disclosure can be implemented without use of these specific details. In other embodiments, well-known structures and processes will not be described in detail to avoid unnecessary details making the descriptions of the present disclosure obscure. Therefore, the present disclosure is not intended to be limited to the embodiments shown, but is to be accorded the broadest scope consistent with principles and features disclosed herein.

Liquid crystal display technology uses different transmittance of white light to achieve red, green, and blue (RGB) color display. Due to wide absorption spectrum of organic color barrier, spectrum of backlight through the color barrier is also relatively wide, resulting in a lower color gamut. A combination of quantum dot films and blue light emitting diodes (LEDs) can improve color gamut of LCDs. However, color resists cannot completely absorb light of other wavelengths, which reduces color purity of pure color images under RGB255 gray scale. Traditional technology improves color gamut by increasing thicknesses of the color resists, or adding other absorbing materials to the color resists to increase color gamut. Due to wide absorption spectrum of materials thereof, LCD transmission is significantly reduced, and energy efficiency is increased. Shown in FIG. 1 is a schematic structural diagram of a quantum dot material structure applied in the liquid crystal display device of an embodiment of the present disclosure. As shown in FIG. 1, the quantum dot material structure comprises a quantum dot core, a quantum dot shell, and a quantum dot ligand layer in order from an inside to an outside.

The quantum dot core comprises a cadmium arsenide magic-size ($Cd_3As_2$ Magic-Size).

In the present embodiment, a peak position of an absorption spectrum of the cadmium arsenide magic-size is 535 nm, and a peak of an emission spectrum is 545 nm. A size of the cadmium arsenide magic-size ranges from 1 nm to 4 nm.

The quantum dot core is used to absorb green light of a predetermined wavelength.

The present embodiment uses an ultra-narrow absorption of the cadmium arsenide magic-size to absorb green light at about 535 nm, which improves light type difference between red light and green light of quantum dots and blue backlight, and reduces chromatic polarization of wide viewing angles.

Manufacturing methods of the cadmium arsenide magic-size can be disposed according to specific conditions. For example, 1.536 g of cadmium oxide powder (12 mmol), 8.75 mL of oleic acid (25 mmol), and 11.25 mL of octadecene solution are placed into a 50 mL three-necked flask, and a reaction system is heated to 100° C. After repeating the operation of vacuuming and introducing nitrogen three times under these conditions, the reaction system is heated to 250° C. until dark red cadmium oxide powder is dispersed and dissolved, and the solution becomes clear and transparent. Then, the reaction system is cooled down to 120° C. Secondly, 0.2228 g of $Mg_3As_2$ ultrafine powder (1.0 mmol) is placed into another 50 mL three-necked flask, the device is ensured to be protected by a nitrogen atmosphere, and then 1.5 mL of a 4.0 mol/L hydrochloric acid solution is injected into the reaction flask, and an reaction of preparing $H_3As$ quickly occurs. Under blowing effect of nitrogen stream, $H_3As$ enters previously used cadmium oleate solution through a scrubbing device filled with $P_2O_5$ powder for water removal. After gas is introduced into the reaction flask, solution color changes rapidly from colorless to dark red, which means generation of the cadmium arsenide magic-size. At different times during the reaction, 0.1 mL of the stock solution is taken from the solution with a syringe and dispersed into 3.0 mL of toluene solution for spectrum monitoring. After ten minutes of the reaction, the reaction is completed, and the system is immediately cooled to near room temperature. The reaction will produce toxic $H_3As$ gas, so the operation process requires extreme caution, and air tightness of the device and collection of exhaust gas need special attention. Saturated copper sulfate solution and 1.0 mol/L silver nitrate solution are used for a tail gas process.

Chemical reaction of the tail gas process is as follows:

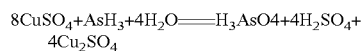

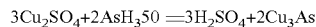

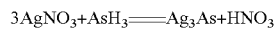

The cadmium arsenide magic-size prepared by the method described above exhibits a deep red color under sunlight, and has an obvious green light emission under ultraviolet light illumination, which corresponds to a position of fluorescence spectrum of materials. The method can achieve numerous preparations of high-quality cadmium arsenide magic-size, and preparation amount of products depends on feeding of reactants. Mass-prepared nanoclusters are separated by rapid centrifugation and then dried in a vacuum oven. Finally, dry powdered nanocluster material has good air stability. Those skilled in the art may use other methods in the prior art to prepare cadmium arsenide magic-size according to descriptions of the present embodiment.

The quantum dot shell is used to protect the quantum dot core.

Similar to most semiconductor nanoclusters, when cadmium arsenide magic-size is present as a solution which lacks chemical stability and is easy to be oxidized, it limits further research and further utilization of materials. In order to further improve stability and optical properties of nanocluster material, the nanocluster material is coated with inorganic inert materials. In the present embodiment, the quantum dot shell is a general quantum dot protective layer with a blocking effect. The role of the quantum dot shell comprises preventing deterioration of materials such as aging, etching, decomposition, oxidation, etc. Materials included in the quantum dot shell can be set according to specific conditions, such as ZnS, ZnSe, $SiO_2$, etc. Quantum dot shell coating method for cadmium arsenide magic-size can be set according to specific conditions. For example, place a certain amount of prepared cadmium arsenide or cadmium phosphide nanocluster compound solution into a three-necked flask, repeatedly vacuum and introduce nitrogen three times, keep the solution temperature at 30° C., and use a syringe to drop an appropriate amount of metal organic compound diethylzinc. After five minutes, add an equimolar amount of episulfide molecules to a reaction system in a same method. After 30 minutes of reaction, obtain a sample thereof to test spectrum. Ultraviolet-visible absorption spectrum and fluorescence spectrum both have a certain red shift, indicating that ZnS shell has been coated on a surface of the nanoclusters. After coating of ZnS shell material, red shift phenomenon occurs in positions of spectral peaks, and the red shifted spectrum still maintains a narrow half-value width. Shown in results of fluorescence efficiency test is that fluorescence quantum efficiency of core-shell structure nanocrystals of cadmium arsenide magic-size reaches 8.0%, which is nearly a five-time improvement over the result of 1.5% of cadmium arsenide nanoclusters. After coating inorganic ZnS material zinc sulfide, materials are dispersed in a toluene solution and are compared with the cadmium arsenide magic-size sample without zinc sulfide coating. After 30 hours of storage in solution, spectrum test shows that characteristic absorption peak of the coated material has not changed significantly and has not been particularly affected. However, absorption spectrum of a pure cadmium arsenide nanocluster material without a zinc sulfide shell changed within 30 minutes, and almost completely disappeared after 3.0 hours. It is should be noted that epitaxial growth of zinc sulfide materials is successful, and stability of nanocluster material, especially the oxidation resistance, has been significantly improved. Those skilled in the art may use other methods in the prior art to coat the nanocluster material with an inorganic inert material according to description of the present embodiment.

In a specific embodiment, it further comprises sample purification. For example, first, a prepared cadmium arsenide magic-size is dispersed in a small amount of n-hexane solution, and is centrifuged at 4,000 rpm for 10 min under condition of polar solvent acetone as a precipitant. The separated precipitate is dispersed into the toluene solution again, and centrifuged again with same parameters for 10 minutes by using methanol solution as a precipitant. Isolated and precipitated product is dispersed again in nonpolar solvents for testing characterization. It should be noted that the prepared cadmium arsenide nanocluster material is unstable when it is present as a solution and is easily oxidized. Therefore, purification process needs to be performed in a glove box. All solvents used are processed with anhydrous and oxygen. The powder drying process must be performed in a vacuum oven. All operations must be rigorous and serious.

The quantum dot ligand layer is used to promote a structural dispersion of the quantum dot material.

In a preparation system of semiconductor nanoclusters, choice of ligand is very important. A type and amount of ligand directly affect preparation effect. The ligand layer can be used to control size, morphology, activity, and growth of nanoparticles. In the present embodiment, the ligand layer is an organic ligand capable of promoting dispersion of materials and is also an organic ligand causing fluorescence quenching of the materials, such as pyridine, organic acid, alkyl mercaptan, mercapto acid, mercaptoamine, organic amine, organic phosphorus, etc. In the present embodiment, morphology and structure of the quantum dot material can be finely controlled through use of organic molecular ligands. In a preferred embodiment, the quantum dot ligand layer is used to promote dispersion of structure of the quantum dot material in a color resistance system. Those skilled in the art may use other methods in the prior art to prepare the ligand layer according to description of the present embodiment.

In a specific embodiment, the quantum dot shell may be made of ZnSe, ZnS, ZnO, $SiO_2$, and a quantum dot hydrogel.

In the present embodiment, the quantum dot shell is an inorganic protecting shell which comprises one or more constituent of ZnSe, ZnS, ZnO, $SiO_2$, and other materials, and also comprises other high stability composite quantum dots such as hydrogel loaded quantum dot structure, etc. The quantum dot shell has a barrier function, which can protect the quantum dot core and prevent materials from undergoing deterioration such as aging, etching, decomposition, or oxidation.

In a specific embodiment, the quantum dot ligand layer may be made of materials such as pyridine, organic acid, alkyl mercaptan, mercapto acid, mercaptoamine, organic amine, and organic phosphorus.

In the present embodiment, the quantum dot ligand layer is an organic ligand and comprises common quantum dot ligands such as organic amines, organic acids, alkyl mercaptans, organic phosphorus, or pyridine. The quantum dot ligand layer comprises a role to promote material dispersion.

In a specific embodiment, the predetermined wavelength is 535 nm.

Figure 2:
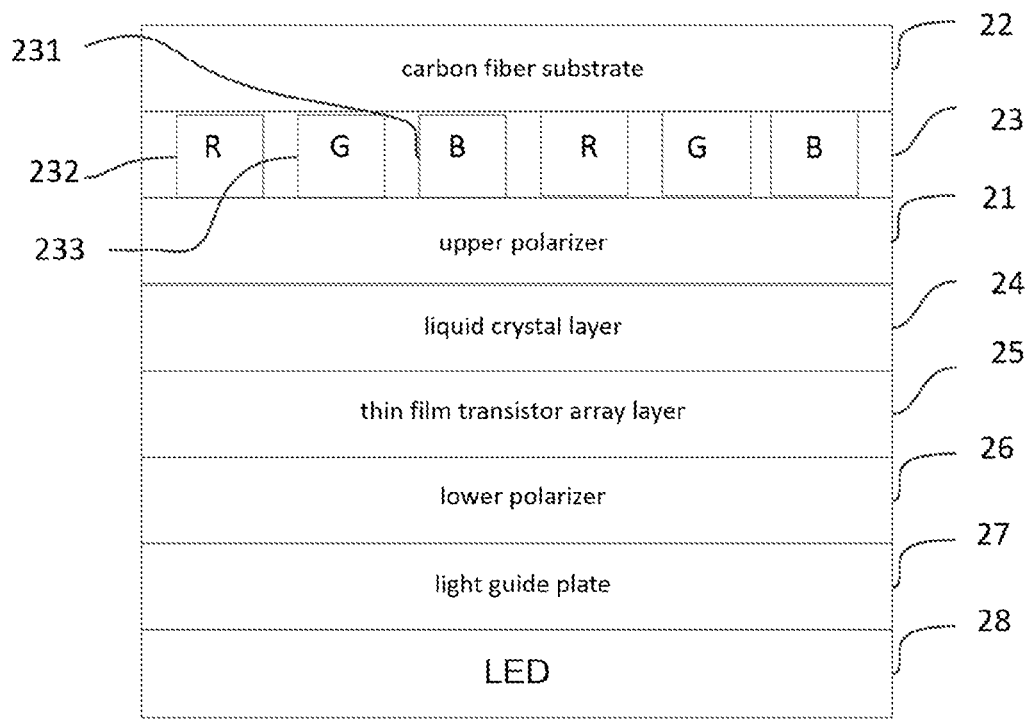
FIG. 2 is a schematic structural diagram of a liquid crystal display device of the embodiment of the present disclosure.

The embodiment of the present disclosure further provides a liquid crystal display device. FIG. 2 is a schematic structural diagram of a liquid crystal display device of the embodiment of the present disclosure. As shown in FIG. 2, the liquid crystal device comprises any one of the above embodiments and preferred embodiments of the quantum dot material structure and a color resistance layer, wherein the color resistance layer 23 comprises a red color resist 232, a blue color resist 231, and a green color resist 233.

In the present embodiment, a structure of the liquid crystal display device can be set according to specific conditions. For example, the liquid crystal display device comprises following structures from top to bottom: a carbon fiber substrate 22, a color resistance layer, an upper polarizer 21, a liquid crystal layer 24, a thin film transistor array layer 25, a lower polarizer 26, a light guide plate 27, and an LED 28. In the present embodiment, the polarizer is preferably a built-in polarizer. Light emitted by each LED 28 is linearly polarized after being selectively absorbed by the lower polarizer 26. A pre-polarized light passes through the thin film transistor array layer 25 and reaches the liquid crystal layer 24. A control signal for the liquid crystal is completed by a thin film transistor array switch. By controlling the thin film transistor array switch, an electric field around corresponding thin film transistor array device is changed, liquid crystal molecules rotate accordingly, and linearly polarized light is selectively transmitted. The linearly polarized light passes through the liquid crystal and is selectively absorbed by the color resistance layer 23, and passes through the upper polarizer 21 that is perpendicular to an absorption axis of the lower polarizer 26, thereby displaying colorful images. Those skilled in the art may use other methods in the prior art to prepare the liquid crystal display device according to description of the present embodiment.

The color resistance layer can accurately absorb light waves in other wavebands through light waves in a small range. In the present embodiment, the manufacturing method of the color resistance layer 23 can be set according to specific conditions. For example, a process sequence of the color resistance layer 23 is generally: photoresist coating, pre-baking, exposure, development, and post-baking. Glass substrates cleaning is required before photoresist coating to ensure surfaces of substrates are clean. Common solutions for photoresist coating are spin coating and roll coating. However, spin coating is not suitable for large-area coating, so roller production is generally used for LCD production. Parameters to be controlled for photoresist coating are mainly coating speed and amount of extrudate. These two parameters directly affect film thickness and coating uniformity. A main purpose of baking is to volatilize the solvent in the photoresist, reduce residual solvent after coating, and enhance adhesion of the photoresist to the glass substrate. A heating principle is to use a thermocouple for partition heating. Temperature and time are main factors affecting quality of pre-baking. An exposure process needs to be performed in a yellow light region. The exposure is to transfer images to the surface of the glass substrate through ultraviolet (UV) light through masks, so that an irradiated photoresist undergoes a chemical reaction. Contact type, near field type, projection type are the three commonly used exposure optical systems. Main control parameters of exposure are amount of exposure, a distance from light source to the substrate, and exposure time. The exposure process directly affects accuracy of required pattern and is the most important link in entire process. Development is to dissolve unnecessary pattern parts with a developing solution, so that images can be completely displayed on the substrate. For positive photoresist, development will dissolve an exposed part; for negative photoresist, development will dissolve an unexposed part. Negative photoresist is commonly used in color filter. Development needs to strictly control solubility of developers and development time. Insufficient or excessive development will seriously affect pattern accuracy, which will affect display effect. Post-baking is to drive away the solvent in the photoresist, so that the photoresist undergoes thermal polymerization reaction to increase chemical stability of the photoresist to remove moisture and make film layers strong. Post-baking needs to consider temperature uniformity and film layer heat resistance.

In a specific embodiment, the quantum dot material structure is dispersed in the red color resist and the blue color resist.

In the present embodiment, the above quantum dot materials are respectively dispersed in the red color resist and the blue color resist, and coated to form a film. The present embodiment can reduce light leakage of the blue color resist around 530 nm, and improve color purity of the blue color resist. The present embodiment can solve problems in the prior art that the RGB color resists cannot completely absorb light of other wavelengths, which reduces color purity of the liquid crystal display device, and reduces color gamut that affects visual effect. A traditional method of improving color gamut is to increase color resistance film thickness. By comparing spectrum of RGB color resists with different thicknesses, it can be seen that as film thickness increases, transmittance of spectrum decreases significantly, and height at half maximum also decreases. A film thickness variation of RGB color resists approximately meets Beer-Lambert law: when a beam of parallel monochromatic light passes vertically through a uniform non-scattering light-absorbing substance, its absorbance A is proportional to concentration c of the light-absorbing substance and thickness b of an absorption layer. Although light transmitted through the RGB color resist is not monochromatic light, it is of a narrow spectrum. Pigment particles of RGB color resist also have a scattering effect. The film thickness change of RGB color resist will deviate from Beer-Lambert law, but it has no effect on analysis of trend of RGB color resist with film thickness. Compared with traditional scheme of using a thicker RGB color resistance film to improve color gamut, the embodiment of the present disclosure can prevent influence on brightness. Compared with the current method of adding other absorbing materials to the RGB color resists to improve color gamut, the present disclosure has higher energy efficiency and lower cost.

In a specific embodiment, the liquid crystal display device further comprises a blue diode light source.

In the present embodiment, the blue diode light source has a blue spectrum and a blue light wavelength can be range from 430 nm to 450 nm.

Figure 3:
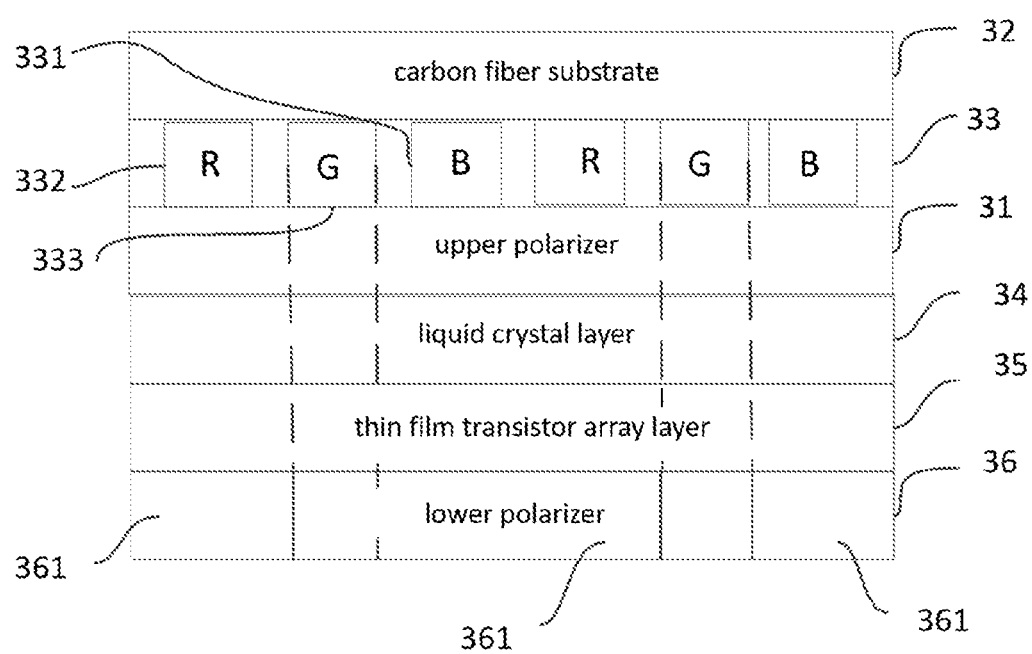
FIG. 3 is another schematic structural diagram of the liquid crystal display device of the embodiment of the present disclosure.

The embodiment of the present disclosure further provides a liquid crystal display device. FIG. 3 is another schematic structural diagram of a liquid crystal display device of the embodiment of the present disclosure. As shown in FIG. 3, the liquid crystal device comprises a color resistance layer and a polarizing layer.

The color resistance layer 66 comprises a red color resist 332, a blue color resist 331, and a green color resist 333.

A projection position 361 corresponding to the red color resist 332 and the blue color resist 331 on the polarizing layer is coated with any of the quantum dot material structures in the above embodiments and the preferred embodiments.

In the present embodiment, the structure of the liquid crystal display device can be set according to specific conditions. For example, there are an upper polarizer 31, a carbon fiber substrate 32, a color resistance layer, a liquid crystal layer 34, a thin film transistor array layer 35, a lower polarizer 36, a light guide plate, and a LED. The present embodiment can solve problems in the prior art that the RGB color resists cannot completely absorb light of other wavelengths, which reduces color purity of the liquid crystal display device, and reduces color gamut that affects visual effect. Compared with traditional scheme of using a thicker RGB color resistance film to improve color gamut, the embodiment of the present disclosure can prevent influence on brightness. Compared with the current method of adding other absorbing materials to the RGB color resistance to improve color gamut, the present disclosure has higher energy efficiency and lower cost.

In a specific embodiment, the polarizing layer comprises the upper polarizer 31 and the lower polarizer 36, and a quantum dot material structure is coated to the lower polarizer 36.

In the present embodiment, the quantum dot material structure can be separately dispersed in the photo-curable resin, coated on an outside of the lower polarizer 36 of the LCD, and patterned. Correspond the pattern with the blue color resist 331 and the red color resist 332 to prevent influence of the quantum dot material structure on green images.

In a specific embodiment, the quantum dot material structure is coated on an outside of the lower polarizing layer 36.

The embodiment of the present disclosure further provides an electronic device comprising any one of the above embodiments and the preferred embodiments of the liquid crystal display device.

Although the embodiments of the present disclosure have been described with reference to the accompanying drawings, those skilled in the art can make various modifications and variations without departing from spirit and scope of the present disclosure, and such modifications and variations fall within a scope defined by the appended claims.

Compared with traditional scheme of using a thicker RGB color resistance film to improve color gamut, the embodiment of the present disclosure can prevent influence on brightness. Compared with the current method of adding other absorbing materials to the RGB color resists to improve color gamut, the present disclosure has higher energy efficiency and lower cost.

What is claimed is:

1. A quantum dot material structure, applied in a liquid crystal display device;
   wherein the quantum dot material structure comprises a quantum dot core, a quantum dot shell, and a quantum dot ligand layer in order from an inside to an outside;
   the quantum dot core comprises a cadmium arsenide magic-size cluster, and the quantum dot core is used to absorb green light of a predetermined wavelength;
   the quantum dot shell is used to protect the quantum dot core; and
   the quantum dot ligand layer is used to promote a dispersion of the quantum dot material structure.

2. The quantum dot material structure as claimed in claim 1, wherein the quantum dot shell comprises one or more of following materials: ZnSe, ZnS, ZnO, SiO2, and a quantum dot hydrogel.

3. The quantum dot material structure as claimed in claim 1, wherein the quantum dot ligand layer comprises one or more of following materials: pyridine, organic acid, alkyl mercaptan, organic amine, and organic phosphorus, the organic acid includes mercapto acid, and the organic amine includes mercaptoamine.

4. The quantum dot material structure as claimed in claim 1, wherein the predetermined wavelength is 535 nm.

5. A liquid crystal display device, comprising a quantum dot material structure and a color resistance layer, applied in the liquid crystal display device;
   wherein the quantum dot material structure comprises a quantum dot core, a quantum dot shell, and a quantum dot ligand layer in order from an inside to an outside;
   the quantum dot core comprises a cadmium arsenide magic-size cluster, and the quantum dot core is used to absorb green light of a predetermined wavelength;
   the quantum dot shell is used to protect the quantum dot core;
   the quantum dot ligand layer is used to promote a dispersion of the quantum dot material structure;
   the color resistance layer comprises a red color resist, a blue color resist, and a green color resist; and
   the quantum dot material structure is distributed in the red color resist and the blue color resist.

6. The liquid crystal display device as claimed in claim 5, wherein the quantum dot shell comprises one or more of following materials: ZnSe, ZnS, ZnO, SiO2, and a quantum dot hydrogel.

7. The liquid crystal display device as claimed in claim 5, wherein the quantum dot ligand layer comprises one or more of following materials: pyridine, organic acid, alkyl mercaptan, organic amine, and organic phosphorus, the organic acid includes mercapto acid, and the organic amine includes mercaptoamine.

8. The liquid crystal display device as claimed in claim 5, wherein the predetermined wavelength is 535 nm.

9. The liquid crystal display device as claimed in claim 5, wherein the liquid crystal display device comprises a blue diode light source.

10. A liquid crystal display device, comprising a color resistance layer and a polarizing layer;
wherein the color resistance layer comprises a red color resist, a blue color resist, and a green color resist;
a quantum dot material structure is coated on the polarizing layer corresponding to projection positions of the red color resist and the blue color resist;
the quantum dot material structure comprises a quantum dot core, a quantum dot shell, and a quantum dot ligand layer in order from an inside to an outside;
the quantum dot core comprises a cadmium arsenide magic-size cluster, and the quantum dot core is used to absorb green light of a predetermined wavelength;
the quantum dot shell is used to protect the quantum dot core; and
the quantum dot ligand layer is used to promote a dispersion of the quantum dot material structure.

11. The liquid crystal display device as claimed in claim 10, wherein the quantum dot shell comprises one or more of following materials: ZnSe, ZnS, ZnO, SiO2, and a quantum dot hydrogel.

12. The liquid crystal display device as claimed in claim 10, wherein the quantum dot ligand layer comprises one or more of following materials: pyridine, organic acid, alkyl mercaptan, organic amine, and organic phosphorus, the organic acid includes mercapto acid, and the organic amine includes mercaptoamine.

13. The liquid crystal display device as claimed in claim 10, wherein the predetermined wavelength is 535 nm.

14. The liquid crystal display device as claimed in claim 10, wherein the polarizing layer comprises an upper polarizing layer and a lower polarizing layer; and
the quantum dot material structure is coated on the lower polarizing layer.

15. The liquid crystal display device as claimed in claim 14, wherein the quantum dot material structure is coated on an outside of the lower polarizing layer.

* * * * *